United States Patent
Engstrom

(10) Patent No.: US 7,433,922 B2
(45) Date of Patent: Oct. 7, 2008

(54) METHOD AND SYSTEM FOR COLLECTING AND DISPLAYING AGGREGATE PRESENCE INFORMATION FOR MOBILE MEDIA PLAYERS

(75) Inventor: G. Eric Engstrom, Kirkland, WA (US)

(73) Assignee: Varia LLC, Seattle, WA (US)

( * ) Notice: Subject to any disclaimer, the term of this patent is extended or adjusted under 35 U.S.C. 154(b) by 327 days.

(21) Appl. No.: 10/477,049

(22) PCT Filed: May 10, 2002

(86) PCT No.: PCT/US02/14594

§ 371 (c)(1),
(2), (4) Date: Nov. 7, 2003

(87) PCT Pub. No.: WO02/093408

PCT Pub. Date: Nov. 21, 2002

(65) Prior Publication Data

US 2004/0172481 A1 Sep. 2, 2004

Related U.S. Application Data

(60) Provisional application No. 60/290,592, filed on May 11, 2001.

(51) Int. Cl.
G06F 15/16 (2006.01)
G06F 15/173 (2006.01)
G06F 3/00 (2006.01)

(52) U.S. Cl. ............... 709/205; 709/206; 709/239; 715/738

(58) Field of Classification Search ........... 709/201, 709/205, 216, 217, 218, 206, 239; 715/738
See application file for complete search history.

(56) References Cited

U.S. PATENT DOCUMENTS

| | | | | |
|---|---|---|---|---|
| 5,153,902 A | * | 10/1992 | Buhl et al. | 455/432.1 |
| 5,493,692 A | * | 2/1996 | Theimer et al. | 455/26.1 |
| 5,734,487 A | * | 3/1998 | Rossi | 398/115 |
| 5,793,365 A | * | 8/1998 | Tang et al. | 715/758 |
| 5,963,861 A | * | 10/1999 | Hanson | 455/456.1 |
| 6,014,090 A | * | 1/2000 | Rosen et al. | 340/905 |
| 6,212,548 B1 | * | 4/2001 | DeSimone et al. | 709/204 |
| 6,331,825 B1 | * | 12/2001 | Ladner et al. | 340/988 |
| 6,448,978 B1 | * | 9/2002 | Salvador et al. | 715/741 |
| 6,522,875 B1 | * | 2/2003 | Dowling et al. | 455/414.3 |
| 6,571,279 B1 | * | 5/2003 | Herz et al. | 709/217 |
| 6,650,891 B1 | * | 11/2003 | Wierzbitzki et al. | 455/414.3 |
| 7,107,063 B1 | * | 9/2006 | Bates et al. | 455/456.1 |
| 2002/0035605 A1 | * | 3/2002 | McDowell et al. | 709/206 |
| 2002/0123356 A1 | * | 9/2002 | Michaud et al. | 455/457 |

* cited by examiner

*Primary Examiner*—Kenny S Lin
(74) *Attorney, Agent, or Firm*—Schwabe, Williamson & Wyatt P.C.

(57) ABSTRACT

The invention is directed to mobile device (FIG. 5, No 502) that obtains presence information for multiple users of other mobile devices (FIG. 5, No 508) and aggregating this information for display by at least one of the users. The aggregated presence information can include the physical (FIG. 5, No 516), virtual and ordinal (FIG. 5, Nos 512 and 514) locations for multiple users of the invention. Each user can opt in to, or out of, displaying at least a portion of the aggregated presence information in real time or over time (FIG. 5, No 504). Also statistics can be provided for analyzing presence information over time.

21 Claims, 10 Drawing Sheets

METHOD AND SYSTEM FOR COLLECTING AND DISPLAYING AGGREGATE PRESENCE INFORMATION FOR MOBILE MEDIA PLAYERS

CROSS REFERENCE TO RELATED APPLICATIONS

This utility application is related to a previously filed U.S. Provisional Application, Ser. No. 60/290,592, filed on May 11, 2001, the benefit of the earlier filing date of which is hereby claimed under 35 U.S.C. § 119(e).

FIELD OF THE INVENTION

The present invention is related to mobile telecommunication devices, and more specifically to providing aggregated presence information with a mobile media player.

BACKGROUND OF THE INVENTION

Since their introduction, the number of services and features for cellular telephones has steadily increased. At first, these mobile devices operated on analog wireless networks that enabled voice communication and simple paging features. Later, digital wireless networks for cellular telephones were implemented to provide more advanced features for voice and data communication, such as encryption, caller identification and short message service (SMS) text messages. More recently, some cellular telephones enable the browsing of web pages on the Internet, tuning to radio stations, playing streamed content, or other on-line services.

The functionality of cellular telephones has continued to increase and incorporate many of the features originally provided for in handheld electronic devices such as personal digital assistants (PDAs). Relatively simple PDA features such as keeping a list of contacts, a calendar, appointments, and the like have been generally integrated into recent cellular telephone models. However, cellular telephone users have not been able to readily receive aggregated information regarding the location or "presence" of other users in the physical, virtual or ordinal sense. Typically, a cellular telephone user had to access a separate source to determine aggregated location information regarding other users.

SUMMARY OF THE INVENTION

The present invention is directed to a method for aggregating presence information for multiple users of mobile devices. A presence for each user of a mobile device is determined and the presences by location are aggregated together. At least a portion of an aggregated user presence by location is provided for display on a mobile device.

Another aspect of the invention is directed to enabling a selective display by location for at least one portion of the aggregated user presence. Also, a selective display of a statistic by location for at least one portion of the aggregated user presence can be provided. Additionally, a selective display of a Pal list by location for at least one portion of the aggregated user presence can be provided.

Yet another aspect of the invention is directed to determining the presence for each user by including a physical location for each user. Also, the presence for each user can be determined by including a virtual location for each user. For example, the virtual location can include a page in a web site, multiple dimensional virtual environment and interactive media presentation. Additionally, the presence for each user can be determined by including an ordinal location for each user. For example, a position in streamed visual content, streamed audio content and broadcast content from a radio station and a television channel.

Still another aspect of the invention is directed to enabling at least a portion of the aggregated user presence by location to be displayed on a stationary computing device. Also, at least a portion of the aggregated user presence by location can be displayed in real time or over time.

Yet another aspect of the invention is directed to displaying aggregated presence information with a mobile device in substantially the same way as the method discussed above.

DETAILED DESCRIPTION OF THE PREFERRED EMBODIMENT

Figure 1:
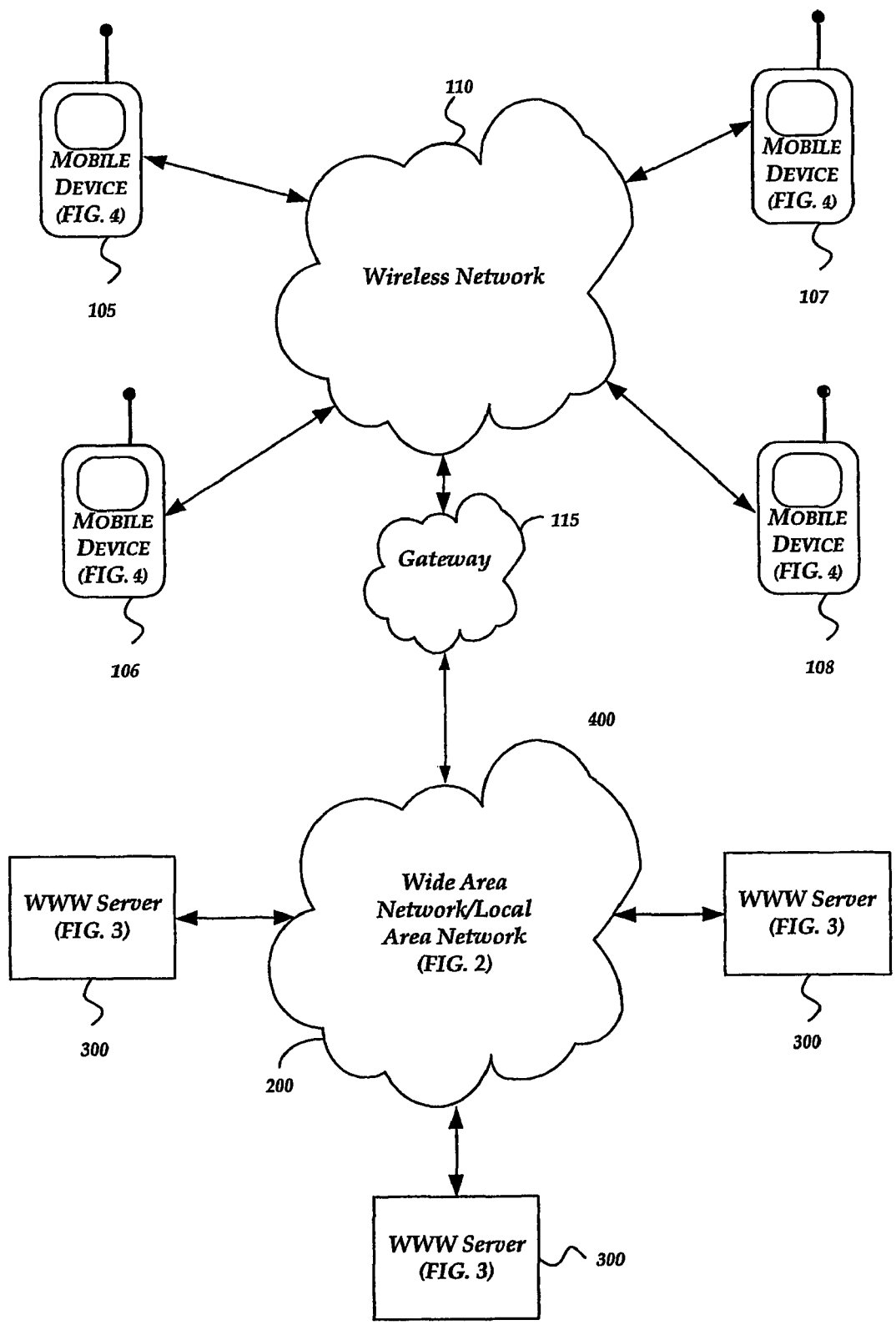
FIG. 1 illustrates a schematic diagram that shows an exemplary system overview.

In the following detailed description of exemplary embodiments of the invention, reference is made to the accompanied drawings, which form a part hereof, and which is shown by way of illustration, specific exemplary embodiments of which the invention may be practiced. Each embodiment is described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The term "a broadcast spectrum" means any portion or portions of the range of frequencies, channels, or Internet addresses employed for broadcasting that can be selected for tuning in conjunction with the practice of the invention disclosed herein. The term "broadcast" includes but is not limited to commercial and non-commercial radio and television stations, Internet radio and the like. The term "user preference" can include a plurality of elements. For example, a user preference for disco music circa 1980 has at least two elements, i.e., the type of music and the era.

The term "location" or "presence" includes anything on which a position of a user may be expressed, e.g., the physical, virtual and ordinal location of the user. The physical location may be determined in many ways, including, but not limited to, manual input from a user, Global Positioning System (GPS) information, Assisted GPS and wireless signal triangulation. The virtual location may be expressed including, but not limited to, the current page(s) being browsed and positions within multi-dimensional virtual environments or interactive multimedia presentations. Also, the ordinal location may be expressed as the location within including, but not limited to, user interface displays, and positions within streamed and/or broadcast content, such as song on a radio station or television show on a video channel.

The term "user interface" can include any type of element that is selectable on a mobile device, including, but not limited to, push-button, rocker switch, slider, dial, key, mouse, pointer, touch-sensitive pad, touch sensitive screen, and soft key.

The term "mobile device" or "mobile media player" includes any device capable of connecting to a wireless network. Such devices include cellular telephones, smart phones, pagers, radio frequency (RF) devices, infrared (IR) devices, citizen band radios (CBs), integrated devices combining one or more of the preceding devices, and the like. Mobile devices may also include other devices that have a wireless interface such as PDAs, handheld computers, personal computers, multiprocessor systems, microprocessor-based or programmable consumer electronics, network PCs, wearable computers, and the like.

Referring to the drawings, like numbers indicate like parts throughout the views. Additionally, a reference to the singular includes a reference to the plural unless otherwise stated or is inconsistent with the disclosure herein.

The present invention is directed to obtaining presence information for multiple users of mobile devices and aggregating this information for display by at least one of the users. The aggregated presence information can include the physical, virtual and ordinal locations for multiple users of the invention. Each user can opt in to, or out of, displaying at least a portion of the aggregated presence information in real time or over time. Also, statistics can be provided for analyzing aggregated presence information over time.

Illustrative Operating Environment

With reference to FIG. 1, an exemplary system in which the invention operates includes wireless mobile devices 400, wireless network 110, gateway 115, wide area network (WAN)/local area network (LAN) 200 and one or more world wide web (WWW) servers 330.

Figure 4:
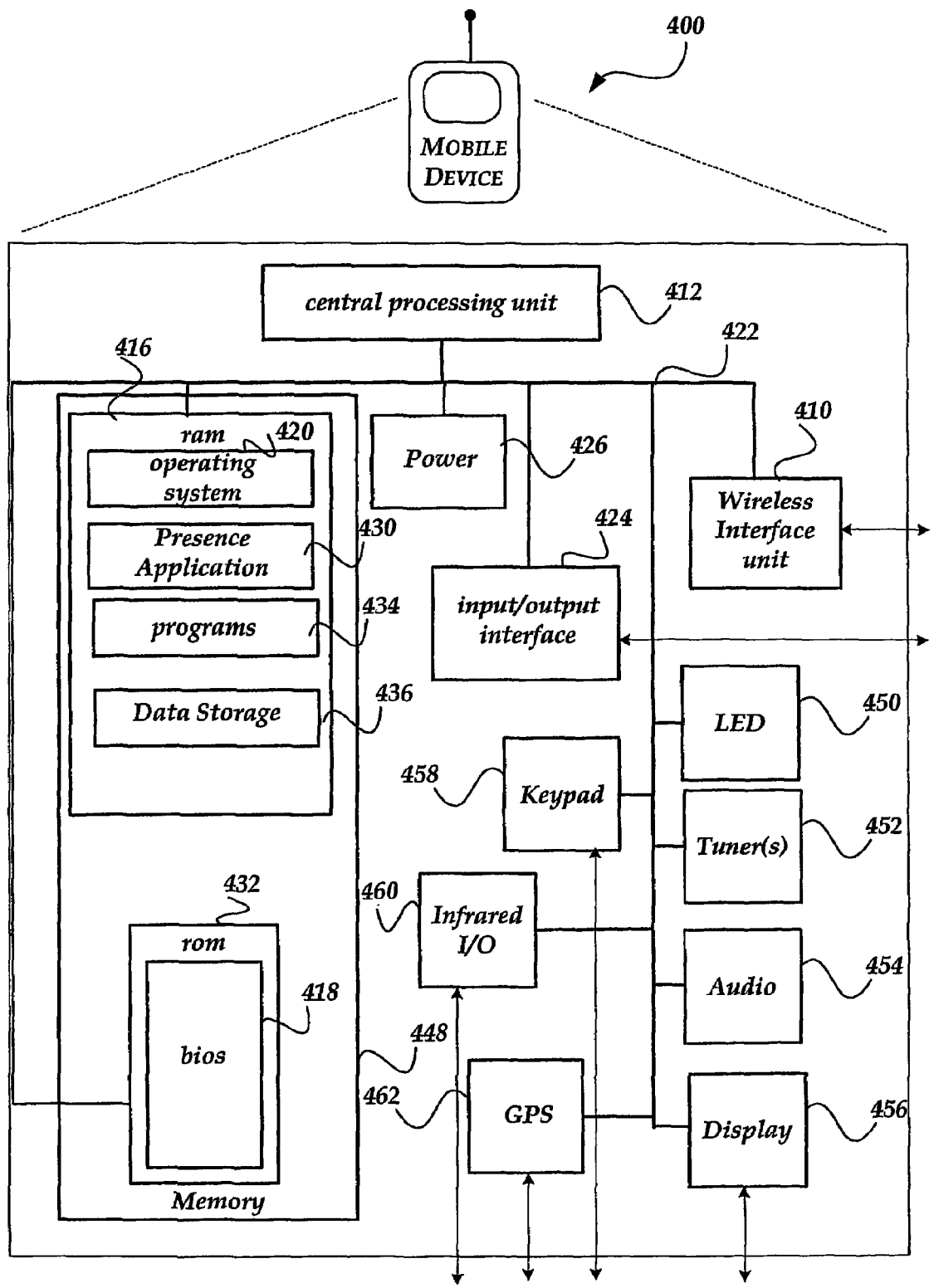
FIG. 4 shows a schematic diagram that illustrates an exemplary mobile device that is operative to play media.

Mobile devices 400 are coupled to wireless network 110 and are described in more detail in conjunction with FIG. 4. Wireless network 110 transports information to and from devices capable of wireless communication, such as mobile devices 400. Wireless network 110 may include both wireless and wired components. For example, wireless network 110 may include a cellular tower that is linked to a wired telephone network. Typically, the cellular tower carries communication to and from cell phones, pagers, and other wireless devices, and the wired telephone network carries communication to regular phones, long-distance communication links, and the like.

Wireless network 110 is coupled to WAN/LAN through gateway 115. Gateway 115 routes information between wireless network 110 and WAN/LAN 200. For example, a user using a wireless device may browse the Internet by calling a certain number or tuning to a particular frequency. Upon receipt of the number, wireless network 110 is configured to pass information between the wireless device and gateway 115. Gateway 115 may translate requests for web pages from wireless devices to hypertext transfer protocol (HTTP) messages, which may then be sent to WAN/LAN 200. Gateway 115 may then translate responses to such messages into a form compatible with the requesting device. Gateway 115 may also transform other messages sent from mobile devices 400 into information suitable for WAN/LAN 200, such as e-mail, audio, voice communication, contact databases, calendars, appointments, and the like.

Figure 2:
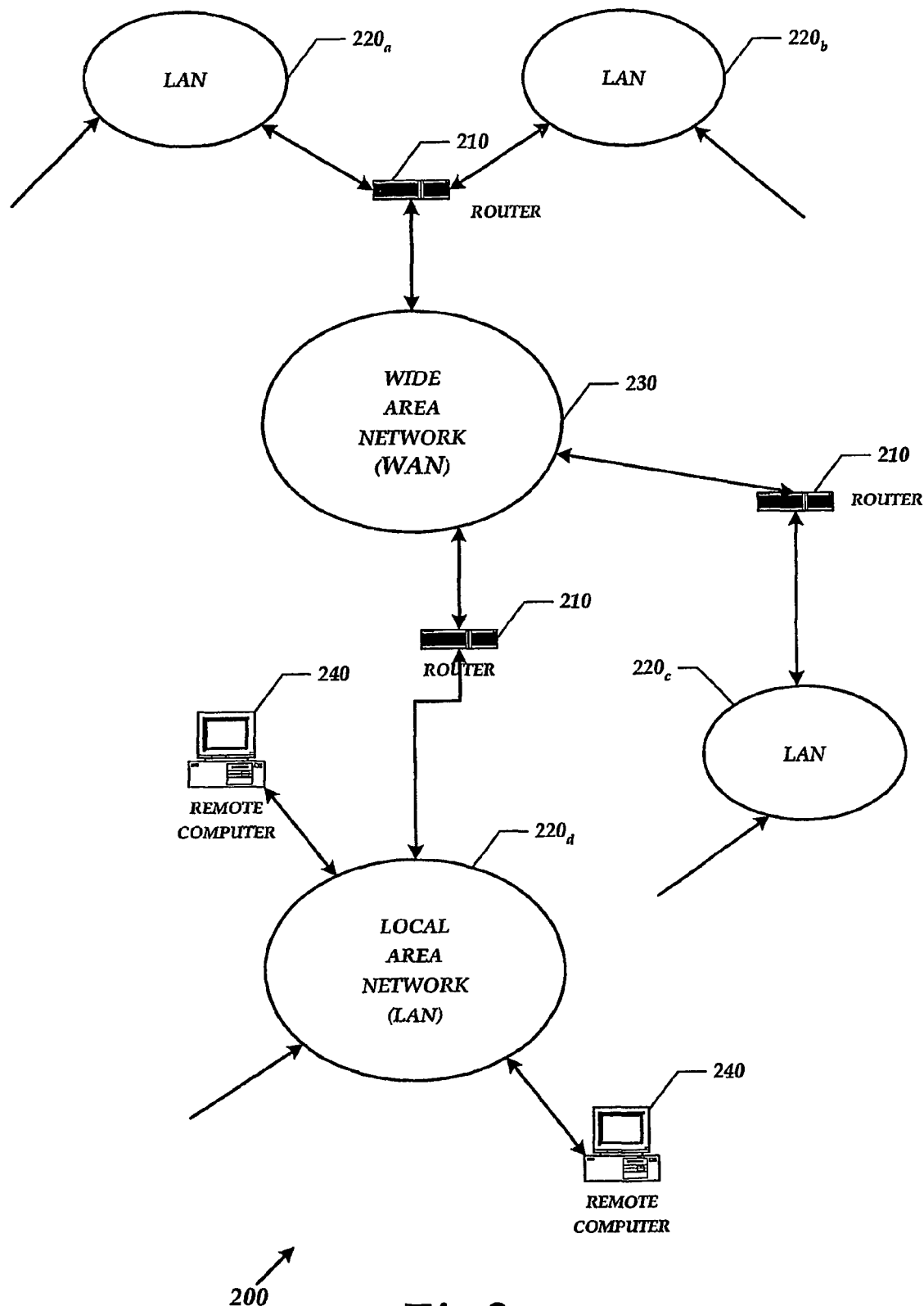
FIG. 2 shows a schematic diagram that illustrates an exemplary system overview in which local area networks and a wide area network are interconnected by routers.

Typically, WAN/LAN 200 transmits information between computing devices as described in more detail in conjunction with FIG. 2. One example of a WAN is the Internet, which connects millions of computers over a host of gateways, routers, switches, hubs, and the like. An example of a LAN is a network used to connect computers in a single office. A WAN may connect multiple LANs.

WWW servers 330 are coupled to WAN/LAN 200 through communication mediums. WWW servers 330 provide access to information and services as described in more detail in conjunction with FIG. 3.

FIG. 2 shows another exemplary system in which the invention operates in which a number of local area networks ("LANs") $220_{a-d}$ and wide area network ("WAN") 230 interconnected by routers 210. Routers 210 are intermediary devices on a communications network that expedite message delivery. On a single network linking many computers through a mesh of possible connections, a router receives transmitted messages and forwards them to their correct destinations over available routes. On an interconnected set of LANs—including those based on differing architectures and protocols—, a router acts as a link between LANs, enabling messages to be sent from one to another. Communication links within LANs typically include twisted wire pair, fiber optics, or coaxial cable, while communication links between networks may utilize analog telephone lines, full or fractional dedicated digital lines including T1, T2, T3, and T4, Integrated Services Digital Networks (ISDNs), Digital Subscriber Lines (DSLs), wireless links, or other communications links. Furthermore, computers, such as remote computer 240, and other related electronic devices can be remotely connected to either LANs $220_{a-d}$ or WAN 230 via a modem and temporary telephone link. The number of WANs, LANs, and routers in FIG. 2 may be increased or decreased without departing from the spirit or scope of this invention. As such, it will be appreciated that the Internet itself may be formed from a vast number of such interconnected networks, computers, and routers and that an embodiment of the invention could be practiced over the Internet without departing from the spirit and scope of the invention.

The media used to transmit information in communication links as described above illustrates one type of computer-readable media, namely communication media. Generally, computer-readable media includes any media that can be accessed by a computing device. Computer-readable media may include computer storage media, communication media, or any combination thereof.

Communication media typically embodies computer-readable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example, communication media includes wired media such as twisted pair, coaxial cable, fiber optics, wave guides, and other wired media and wireless media such as acoustic, RF, infrared, and other wireless media.

The Internet has recently seen explosive growth by virtue of its ability to link computers located throughout the world. As the Internet has grown, so has the WWW. Generally, the WWW is the total set of interlinked hypertext documents residing on HTTP servers around the world. Documents on the WWW, called pages or Web pages, are typically written in HTML (Hypertext Markup Language) or some other markup language, identified by URLs (Uniform Resource Locators) that specify the particular machine and pathname by which a file can be accessed, and transmitted from server to end user using HTTP. Codes, called tags, embedded in an HTML document associate particular words and images in the document with URLs so that a user can access another file, which may literally be halfway around the world, at the press of a key or the click of a mouse. These files may contain text (in a variety of fonts and styles), graphics images, movie files, media clips, and sounds as well as Java applets, ActiveX controls, or other embedded software programs that execute when the user activates them. A user visiting a Web page also may be able to download files from an FTP site and send messages to other users via email by using links on the Web page.

Figure 3:
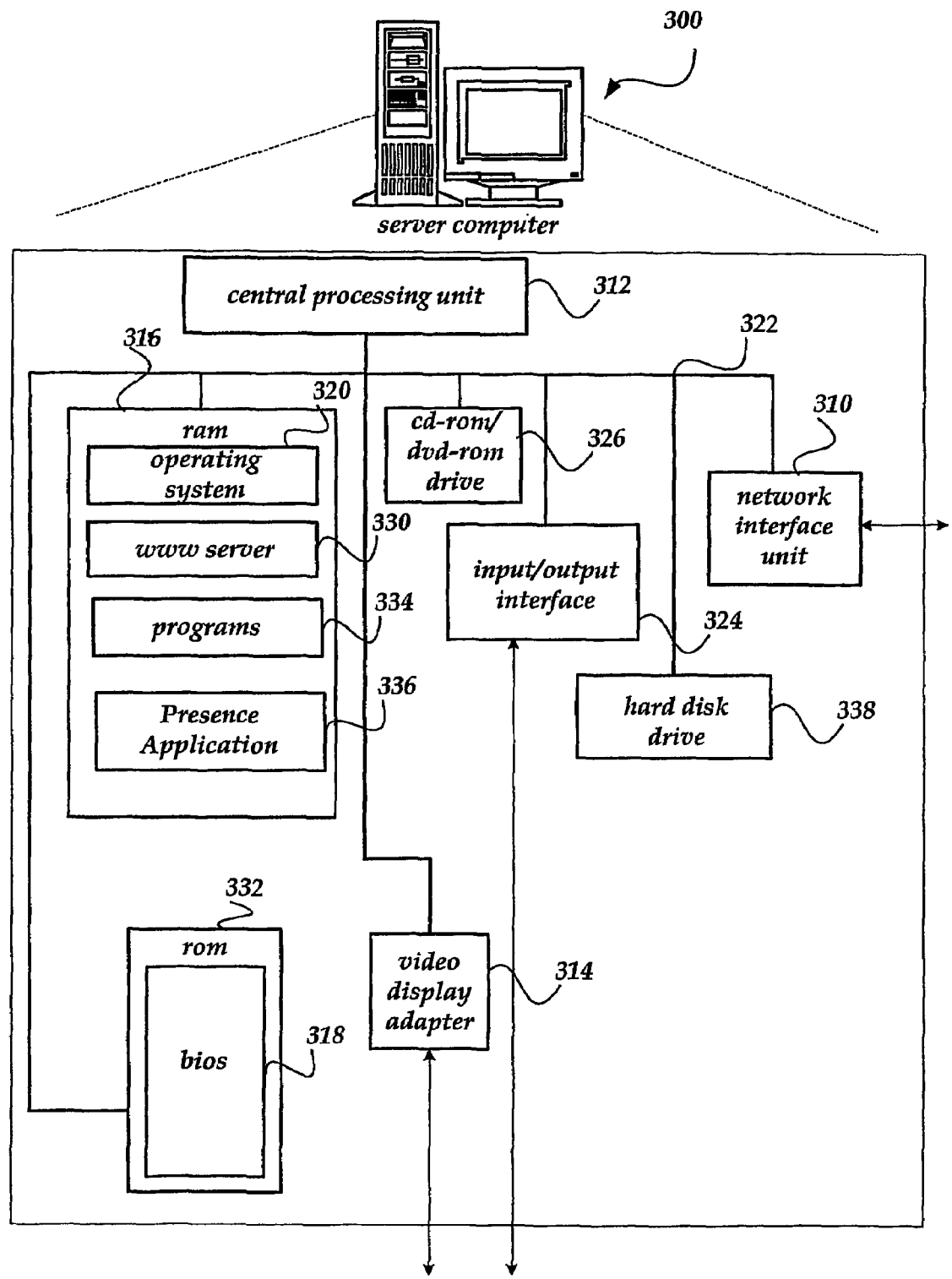
FIG. 3 illustrates a schematic diagram that shows an exemplary server computer.

A server computer, as described in more detail in conjunction with FIG. 3, is a computer connected to the Internet having storage facilities for storing hypertext documents for a WWW site and running administrative software for handling requests for the stored hypertext documents. A hypertext document normally includes a number of hyperlinks, i.e., highlighted portions of text which link the document to another hypertext document possibly stored at a WWW site elsewhere on the Internet. Each hyperlink is associated with a URL that provides the location of the linked document on a server connected to the Internet and describes the document. Thus, whenever a hypertext document is retrieved from a WWW server, the document is considered to be retrieved from the WWW. A WWW server may also include facilities for storing and transmitting application programs, such as application programs written in the JAVA programming language from Sun Microsystems, for execution on a remote computer. Likewise, a WWW server may also include facilities for executing scripts and other application programs on the WWW server itself.

A user may retrieve hypertext documents from the WWW via a WWW browser application program located on a wired or wireless device. A WWW browser, such as Netscape's NAVIGATOR® or Microsoft's INTERNET EXPLORER®, is a software application program for providing a graphical user interface to the WWW. Upon request from the user via the WWW browser, the WWW browser accesses and retrieves the desired hypertext document from the appropriate WWW server using the URL for the document and HTTP. HTTP is a higher-level protocol than TCP/IP and is designed specifically for the requirements of the WWW. HTTP is used to carry requests from a browser to a Web server and to transport pages from Web servers back to the requesting browser or client. The WWW browser may also retrieve application programs from the WWW server, such as JAVA applets, for execution on a client computer.

FIG. 3 shows an exemplary server computer 300 that includes WWW server 330 that is operative to provide a web site. Accordingly, WWW server 330 transmits web pages to a browser application program executing on requesting devices to carry out this process. For instance, WWW server 330 may transmit pages and forms for receiving information about a user, such as user preferences, address, telephone number, billing information, credit card numbers, and the like. Moreover, WWW server 330 may transmit WWW pages to a requesting device that allow a user to participate in a WWW site. The transactions may take place over the Internet, WAN/LAN 200, or some other communications network.

Those of ordinary skill in the art will appreciate that server computer 300 may include many more components than those shown in FIG. 3. However, the components shown are sufficient to disclose an illustrative embodiment for practicing the present invention. As shown in FIG. 3, server computer 300 is connected to WAN/LAN 200, or other communications network, via network interface unit 310. Those of ordinary skill in the art will appreciate that network interface unit 310 includes the necessary circuitry for connecting server computer 300 to WAN/LAN 200, and is constructed for use with various communication protocols including, but not limited to, the TCP/IP and WAP protocols.

Server computer 300 also includes processing unit 312, video display adapter 314, and a mass memory, all connected via bus 322. The mass memory generally includes RAM 316, ROM 332, and one or more permanent mass storage devices, such as hard disk drive 328, a tape drive, CD-ROM/DVD-ROM drive 326, and/or a floppy disk drive. The mass memory stores operating system 320 for controlling the operation of server computer 300. It will be appreciated that this component may comprise a general purpose server operating system as is known to those of ordinary skill in the art, such as UNIX, LINUX™, or Microsoft WINDOWS NT®. Basic input/output system ("BIOS") 318 is also provided for controlling the low-level operation of server computer 300.

The mass memory as described above illustrates another type of computer-readable media, namely computer storage media. Computer storage media may include volatile and nonvolatile, removable and non-removable media implemented in any method or technology for storage of information, such as computer readable instructions, data structures, program modules or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computing device.

The mass memory also stores program code and data for providing a web site. More specifically, the mass memory stores applications including WWW server 330, programs 334, and location application 336 (See figures and related discussion below). WWW server application 330 includes computer executable instructions which, when executed by server computer 300, generate WWW browser displays, including performing the logic described above. Server computer 300 may include other programs, including, but not limited to, a JAVA virtual machine, an SMTP handler application for transmitting and receiving email, an HTTP handler application for receiving and handing HTTP requests, JAVA applets for transmission to a WWW browser executing on a client computer, and an HTTPS handler application for handling secure connections. The HTTPS handler application may be used for communication with external security applications (not shown), to send and receive private information in a secure fashion.

Server computer 300 also includes input/output interface 324 for communicating with external devices, such as a mouse, keyboard, scanner, or other input devices not shown in FIG. 3. Likewise, server computer 300 may further include additional mass storage facilities such as CD-ROM/DVD-ROM drive 326 and hard disk drive 328. Hard disk drive 328 is utilized by server computer 300 to store, among other things, application programs, databases, and program data used by WWW server application 330. For example, customer databases, product databases, image databases, and relational databases may be stored.

FIG. 4 shows an exemplary mobile device 400, according to one embodiment of the invention. Mobile device 400 may be arranged to transmit and receive data. For instance, mobile device 400 may send and receive SMS text messages from other mobile devices (not shown) and servers (See FIG. 3 and related discussion) as well as receiving broadcasts. For example, mobile device 400 may receive radio broadcasts or television broadcasts. The data transmissions may take place over the Internet, WAN/LAN 200, or some other communications network.

Those of ordinary skill in the art will appreciate that mobile device 400 may include many more components than those shown in FIG. 4. However, the components shown are sufficient to disclose an illustrative embodiment for practicing the present invention. As shown in the figure, mobile device 400 includes processing unit 412, memory 448, RAM 416, ROM 432, operating system 420, application 430, programs 434, data storage 436, bios 418, power 426, input/output interface 424, wireless interface unit 410, LED 450, tuner(s) 452, audio 454, display 456, keypad 458, infrared input/output 460, and GPS interface 462.

Mobile device 400 may connect to WAN/LAN 200, or other communications network, via wireless interface unit 410. Those of ordinary skill in the art will appreciate that wireless interface unit 410 includes the necessary circuitry for connecting mobile device 400 to WAN/LAN 200, and is constructed for use with various communication protocols including the TCP/IP protocol. Wireless interface unit 410 may include a radio layer (not shown) that is arranged to transmit and receive radio frequency communications. Wireless interface unit 410 connects mobile device 400 to external devices, via a communications carrier or service provider.

Mass memory 448 generally includes RAM 416, ROM 432, and one or more data storage units 436. The mass memory stores operating system 420 for controlling the operation of mobile device 400. It will be appreciated that this component may comprise a general purpose server operating system as is known to those of ordinary skill in the art, such as a version of UNIX, LINUX™, or Microsoft WINDOWS®. Basic input/output system ("BIOS") 418 is also provided for controlling the low-level operation of mobile device 400.

The mass memory as described above illustrates another type of computer-readable media, namely computer storage media. Computer storage media may include volatile and nonvolatile, removable and non-removable media implemented in any method or technology for storage of information, such as computer readable instructions, data structures, program modules or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computing device.

The mass memory also stores program code and data used within mobile device 400. More specifically, the mass memory stores applications including location application 430, and programs 434. Programs 434 may include computer executable instructions which, when executed by mobile device 400, transmit and receive WWW pages, e-mail, audio, video, and the like. One or more programs 434 may be loaded into memory 448 and run under control of operating system 420. Location application 430 performs the methods described below. Examples of application programs include radio tuner programs, phone programs, communication programs, productivity programs (word processing, spreadsheet, etc.), browser programs, and the like. Mobile computing device 400 also includes ROM 432. ROM 432 may be used to store data that should not be lost when mobile device 400 loses power.

Mobile device 400 also comprises input/output interface 424 for communicating with external devices, such as a headset, or other input or output devices not shown in FIG. 4. Data storage 436 is utilized by mobile device 400 to store, among other things, application programs, databases, and program data used by the mobile device broadcast delivery application. For example, user databases, product databases, image databases, and relational databases may be stored.

Keypad 458 may be any input device arranged to receive inputs from a user. For example, keypad 458 may include separate push buttons or a keyboard. Display 456 may be a liquid crystal display, or any other type of display commonly used in mobile devices. Display 456 may also be a touch screen arranged to receive a users inputs. Infrared input/output 460 may be used to send and receive infrared commands. GPS interface 462 may be used in a manner consistent with determining positional information from satellite communications and/or triangulation of wireless communications.

Power supply 426 provides power to mobile device 400. According to one embodiment, a rechargeable battery provides power. The power may be also be provided by an external power source, such as an AC adapter or a powered docking cradle that supplements or recharges the battery.

As shown, mobile device 400 includes light emitting diode (LED) display 450, tuner(s) 452, and audio interface 454. LED display 450 may be controlled to remain active for specific periods or events. For example, an LED display may stay on while the phone is powered or may light up in various patterns. The patterns may be a predetermined or random pattern. Audio interface 454 is arranged to receive and provide audio signals. For example, audio interface 454 may be coupled to a speaker (not shown) to provide audio from a telephone call, tuner(s) 452, or from some other audio source. Audio interface 454 may also be coupled to an input device, such as a microphone, to receive audio input. Tuner(s) 452 may be any tuner to receive a broadcast. For example, tuner(s) 452 may be an AM tuner, an FM tuner, an AM/FM tuner, an Internet radio tuner, a television tuner, and the like.

In various embodiments, the mobile device may be a selected one of a wireless mobile phone, a pager, a personal digital assistant (PDA), a palm-sized computing device, a laptop computer, a portable radio, a portable MPx player, and a portable CD/DVD player.

Figure 5:
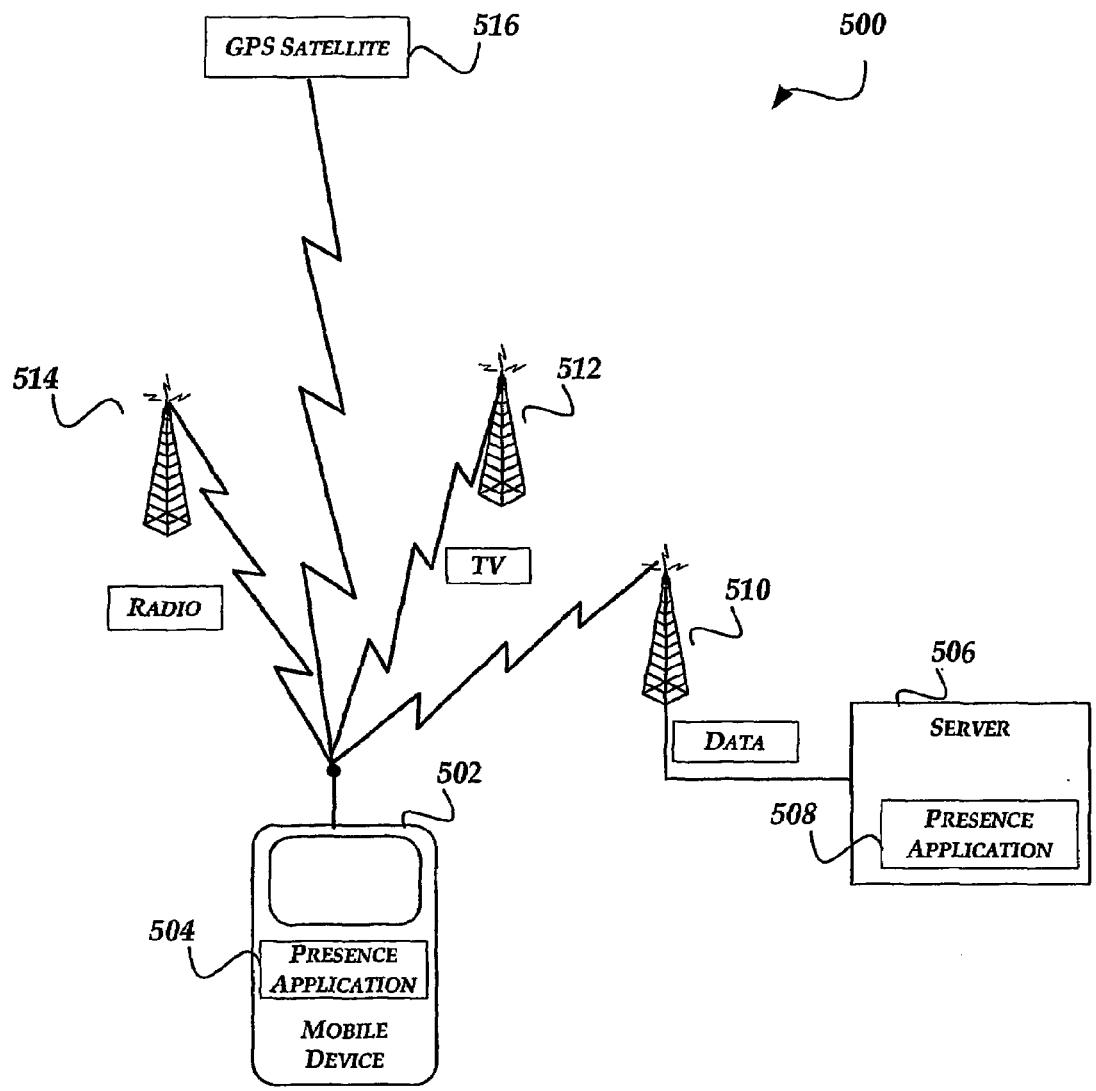
FIG. 5 illustrates a schematic diagram of an exemplary embodiment of a mobile media player that is operative to provide location information and receive aggregated location information.

FIG. 5 is a functional block diagram generally illustrating an overview of system 500 for providing presence information with mobile device 502 and receiving aggregated presence information from server computer 506. In this implementation, server computer 506 is a stationary computing device such as the one described above in conjunction with FIG. 3, and mobile device 502 is a mobile computing device such as the one described above in conjunction with FIG. 4. Mobile device 504 is in communication with several different wireless sources of information and content, including, but not limited to, radio 514, television 512, data 510 and GPS satellite 516.

Presence application 504 is located on mobile device 502 for determining the user's presence information for that particular mobile device and providing this information to presence application 508 located on server computer 506. The user's presence information may include any combination of physical, virtual and ordinal location information. The user's presence information can be provided to presence application 508 for aggregation in real time or at intervals. Also, each user can opt in to, or out of, employing presence application 504 to display in real time, or at intervals, at least a portion of the aggregated presence information provided by presence application 508. Additionally, presence application 508 and/or presence application 504 can provide statistics for analyzing aggregated presence information over time.

Although not shown, multiple users with presence applications on mobile devices are also in communication with the server computer's presence application, and these multiple mobile devices provide their particular user's presence information. Furthermore, in one embodiment, a client-server architecture can be used where each presence application located on a mobile device is a client of a presence application server located on a server computer. In another embodiment, a peer-to-peer architecture is employed where each presence application located either on a mobile device and/or on a stationary computing device determines and aggregates user presence information for multiple users. Additionally, aggregated presence information and presence information may be communicated between the mobile devices and the server by the SMS protocol or some other suitable messaging protocol.

Figure 6:
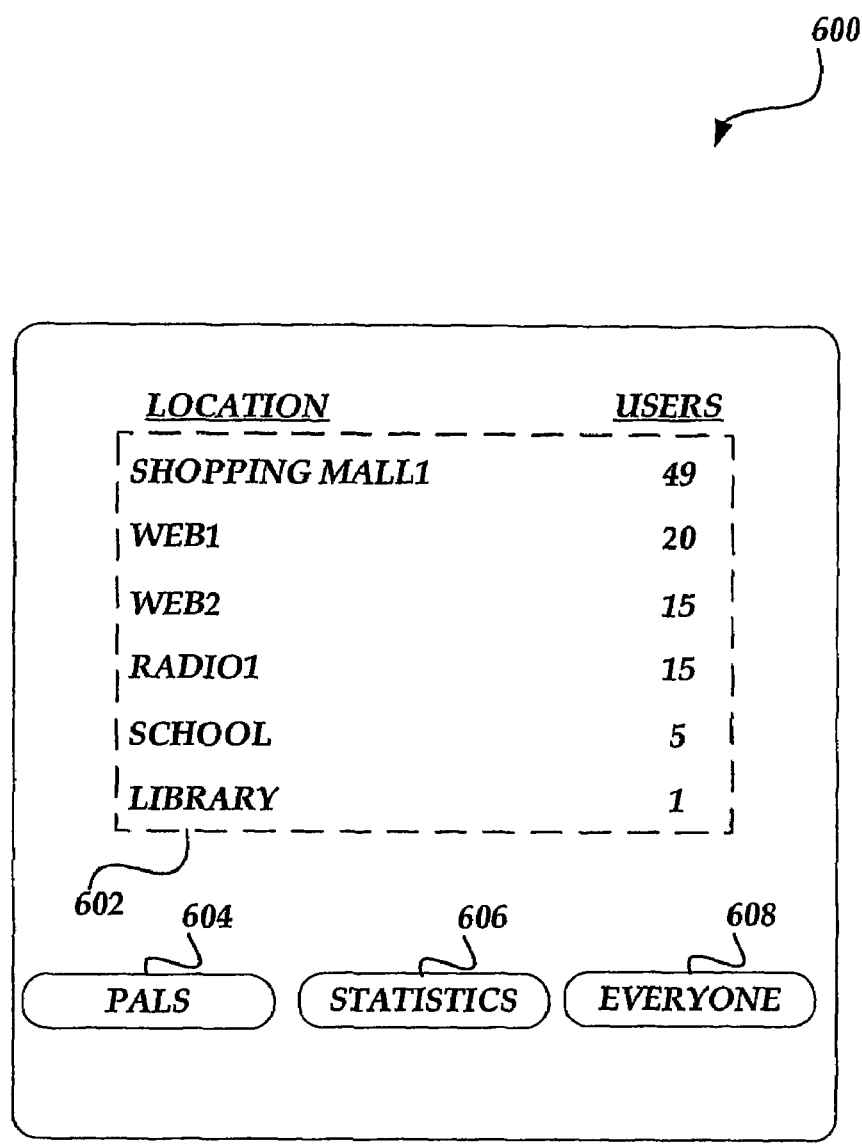
FIG. 6 shows a functional block diagram that generally illustrates one embodiment of a display for aggregated location information.

FIG. 6 illustrates an overview of an exemplary graphical user interface 600 for displaying at least a portion of aggregated presence information for multiple users of the invention. A first column of display 602 includes a listing of locations (presences) where at least one user is located. A second column of display 602 shows the number of users that are currently positioned at the location identified in the first column. The display can be updated at intervals or in real time. Although not shown, the display could be positioned in a portion of a larger display that is employed to provide content to a user, including video and streamed content.

The selection of statistics element 606 will cause user interface 600 to display another screen with statistics relating to the aggregated presence of multiple users at difference locations (not shown). For example, the average number of users that are in school during the day, browse a web site, or listen to a particular song on a radio station.

The selection of everyone element 608 causes user interface 600 to display aggregated presence information for every user. Similarly, the selection of PALS element 604 causes the display of aggregated presence information for each user identified in a PAL list.

The PAL list may include one or more entries for friends, associates and/or acquaintances of the user. This list is similar to a buddy list that may be part of instant messaging systems operating over the Internet.

Figure 7:
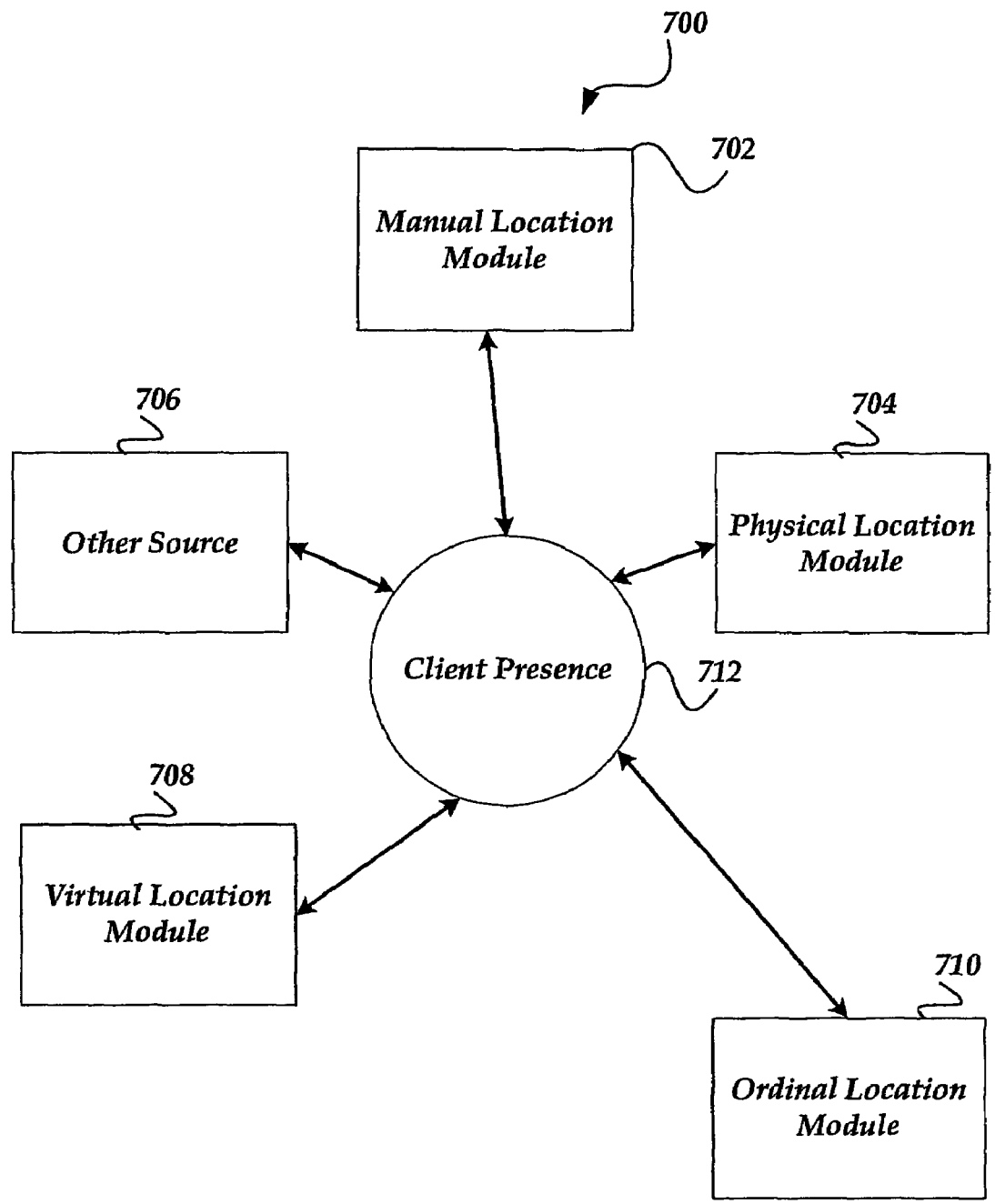
FIG. 7 illustrates a functional block diagram for a client presence application for a mobile device.

FIG. 7 illustrates a functional block diagram for an exemplary client presence module 712, which is operative to function as a client in a client-server architecture and where clients are on mobile devices and a server is remotely located for processing of aggregated presence information.

Client presence module 712 is in communication with several other modules that provide different types of location information, which in total are employed to determine the presence of a user of the mobile device. Manual location module 702 enables manual entry through a user interface of a location for a user. The user may enter any information desired to specify his or her location. The information may be selected from a list of predetermined favorite locations or expressly entered at the mobile device.

Physical location module 704 enables coordinates identifying the physical location of the user's mobile device to be provided. For example, GPS, Assisted GPS and/or triangulation of wireless signals may be analyzed by physical location module 704 to determine the physical location or presence of the user's mobile device.

Ordinal location module 706 enables the ordered location/presence of a user to be determined. For example, the ordinal presence may include streamed visual content, streamed audio content and broadcast content from a radio station and a television channel. Virtual location module 708 enables the virtual location/presence of a user to be determined. For example, a position in a multimedia presentation or multi-dimensional virtual environment such as, but not limited to, a video game or chat room. Additionally, other source module 706 enables the presence of a mobile device user to be determined, e.g., a message from another user of a mobile device that identifies the current location of the mobile device user.

Figure 8:
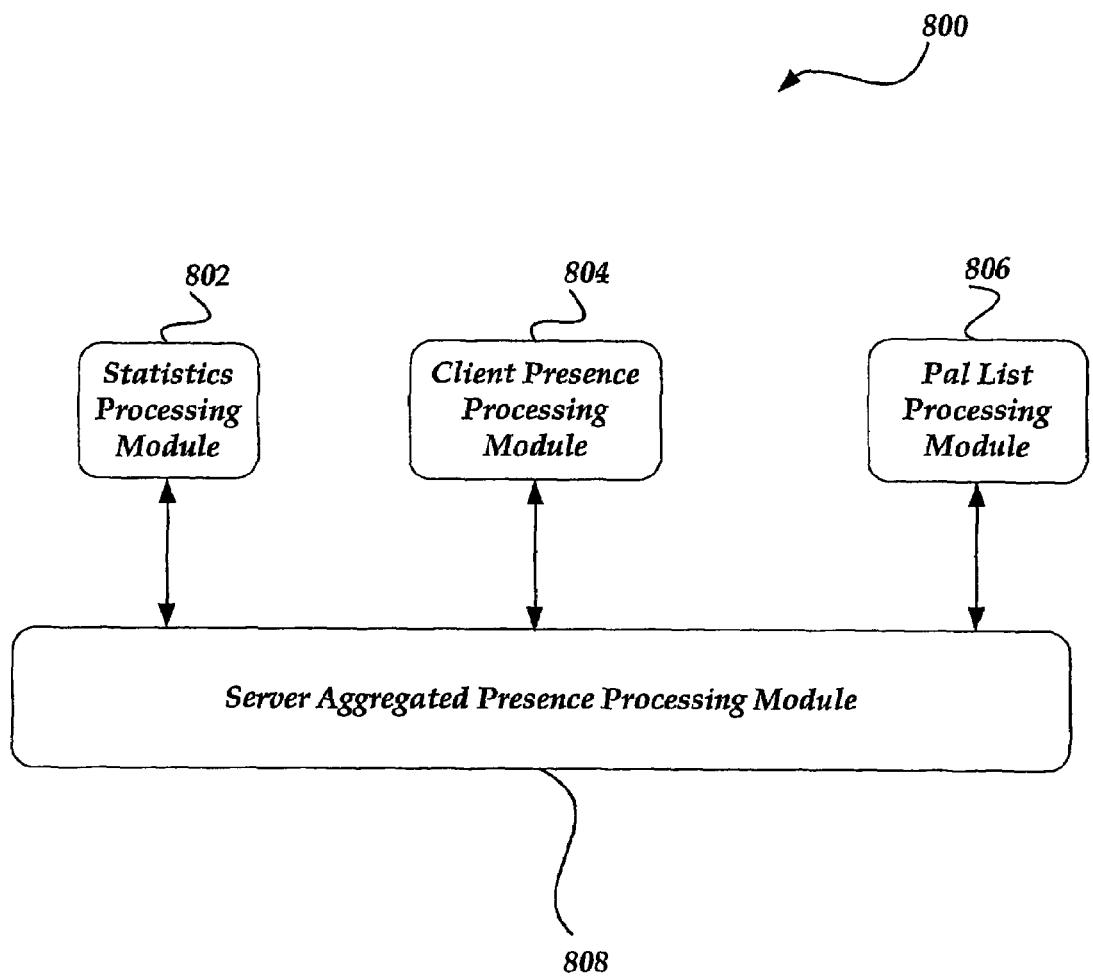
FIG. 8 shows a functional block diagram for a server presence application.

FIG. 8 illustrates a functional block diagram for exemplary server aggregated presence processing module 808, which is operative to function as a server in a client-server architecture, where clients are on mobile devices and the server is remotely located for processing of aggregated presence information. Client presence processing module 804 is employed to receive presence information from each client and communicate aggregated presence information to each client.

Pal list processing module 806 is employed to provide aggregated presence information to at least one client in a Pal list. Statistics processing module 802 is employed to determine various statistics relating to aggregated presence information. Server aggregated presence processing module 808 is employed to determine aggregated presence information from the information provided by each client.

Figure 9:
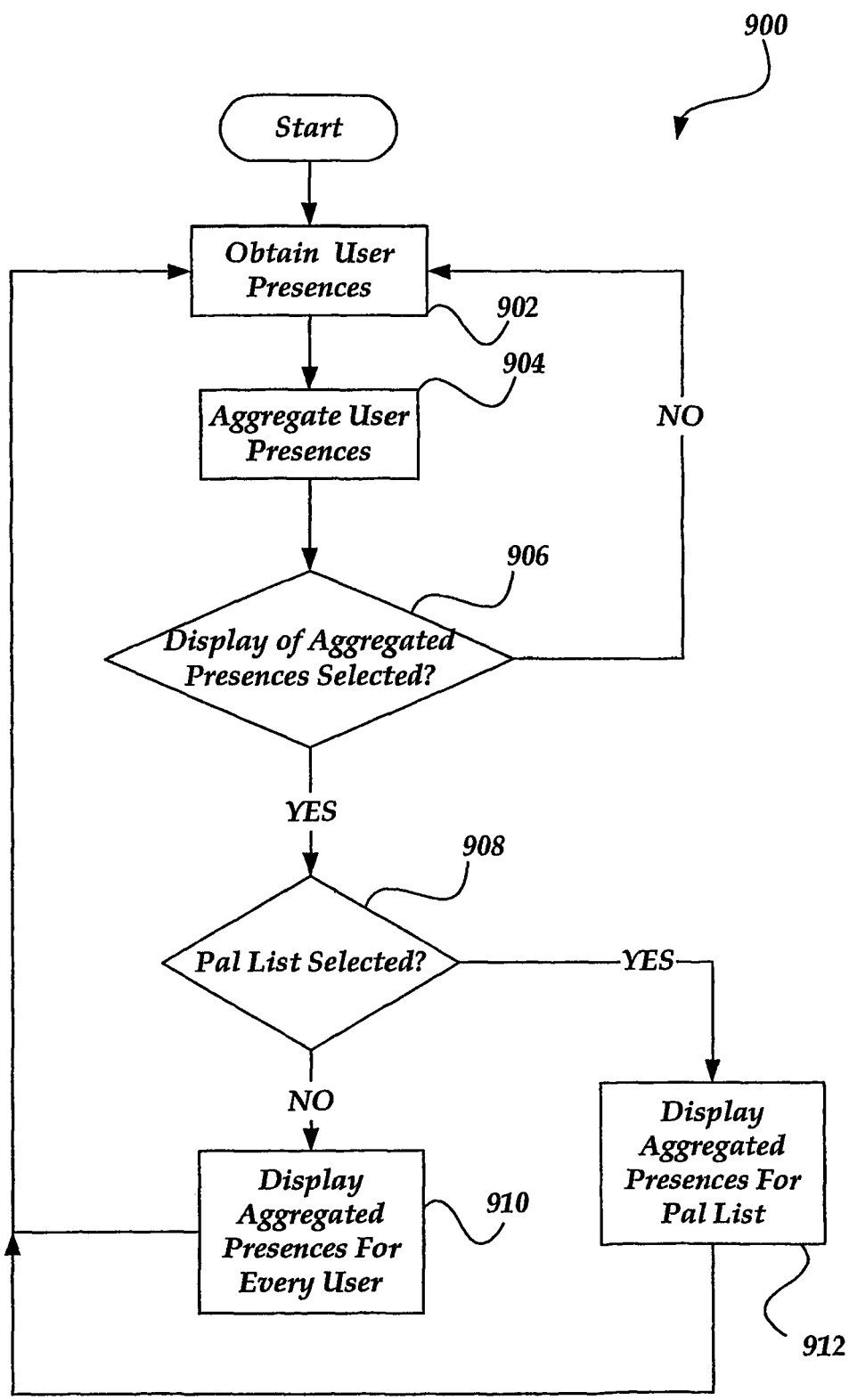
FIG. 9 illustrates a flow chart that shows the actions for processing and displaying user locations.

FIG. 9 illustrates a flow chart for a process 900 for determining and displaying aggregated presence information for multiple mobile device users. Moving from a start block, the process advances to block 902 where user presences are obtained from each mobile device employing the invention. Flowing to block 904, the user presences are aggregated together and aggregated presence information is generated. At decision block 906, a determination is made as to whether a display of aggregated presences is selected. If no, the process loops back to block 902 where substantially the same actions discussed above are performed.

However, if the determination at decision block 906 is affirmative, the process advances to block 908 where a determination is made as to whether a Pal list is selected for display. It is envisioned that any one of several Pal lists could be selected. If true, the process advances to block 912 where aggregated presences for a selected Pal list are displayed. Next, the process loops back to block 902 and continues performing substantially the same actions as discussed above.

Alternatively, when the determination at decision block 908 is false, the process advances to block 910 where the aggregated presence of every user is displayed. Next, the process loops back to block 902 and continues performing substantially the same actions as discussed above.

Additionally, it is envisioned that the displayed aggregated presence information may be provided in real time or represent information collected over time.

Figure 10:
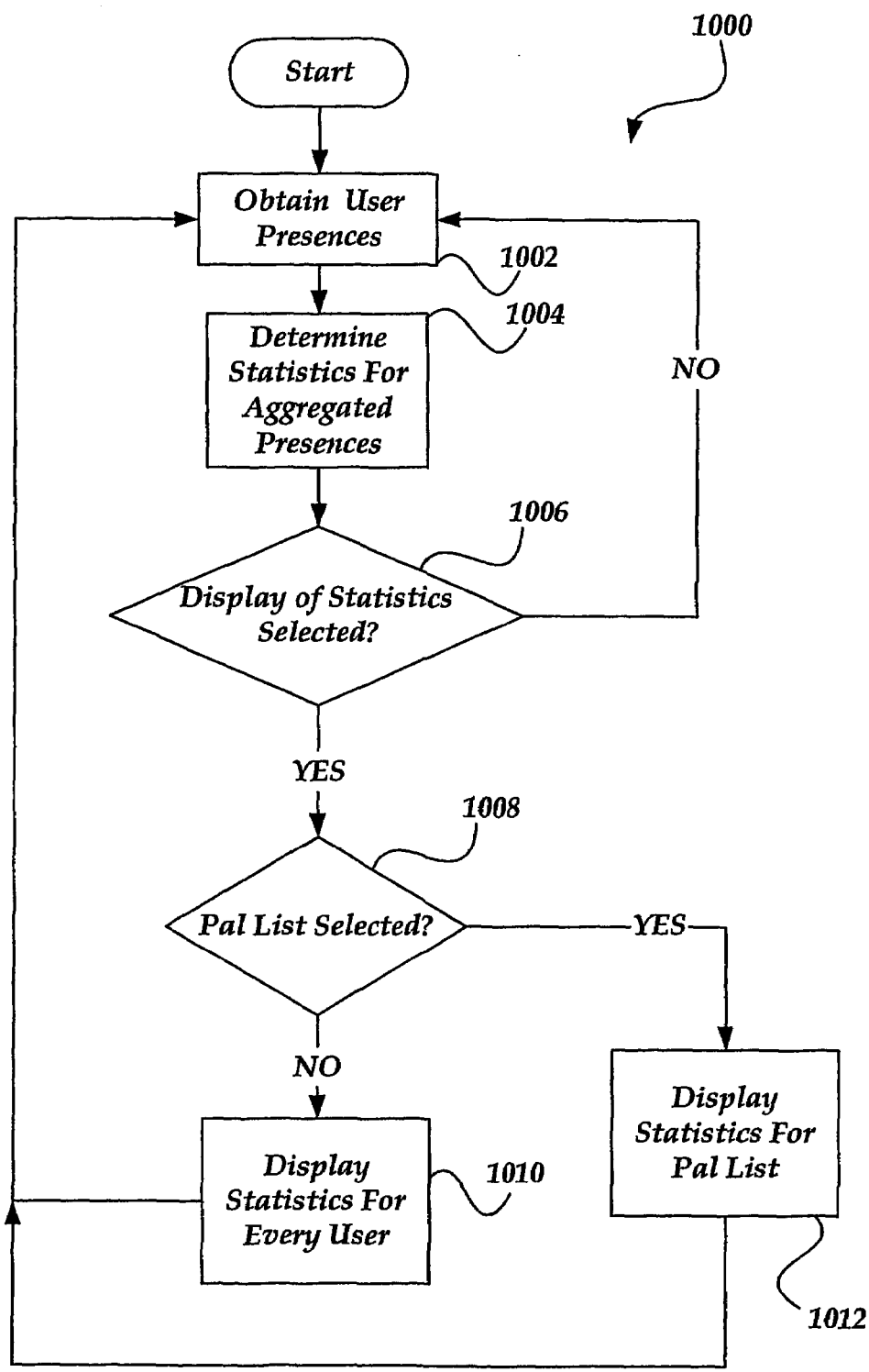
FIG. 10 shows a flow chart that illustrates the actions for processing user locations and displaying statistics in accordance with the present invention.

FIG. 10 illustrates a flow chart for a process 1000 for determining and displaying aggregated presence information for multiple mobile device users. Moving from a start block, the process advances to block 1002 where user presences are obtained from each mobile device employing the invention. Flowing to block 1004, the user presences are aggregated together and statistical information for aggregated presence information is generated. At decision block 1006, a determination is made as to whether a display of statistics is selected. If no, the process loops back to block 1002 where substantially the same actions discussed above are performed.

However, if the determination at decision block 1006 is affirmative, the process advances to block 1008 where a determination is made as to whether a Pal list is selected for display. It is envisioned that any one of several Pal lists could be selected. If true, the process advances to block 1012 where statistics for a selected Pal list are displayed. Next, the process loops back to block 1002 and continues performing substantially the same actions as discussed above.

Alternatively, when the determination at decision block 1008 is false, the process advances to block 1010 where the aggregated presence of every user is displayed. Next, the process loops back to block 1002 and continues performing substantially the same actions as discussed above.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method, comprising:
   (a) determining location information for each of a plurality of subscriber mobile devices, the location information including an ordinal location for at least one of the plurality of subscriber mobile devices;
   (b) aggregating the determined location information; and
   (c) displaying, on a subscriber mobile device, a selective summated display of the aggregated location information corresponding to a particular ordinal location, the selective summated display including the ordinal location of the at least one of the plurality of subscriber mobile devices, the ordinal location comprising a location within a user interface display different from the selective summated display or a position within a streamed and/or broadcast content.

2. The method of claim 1, wherein the selective summated display includes a selective display of a summated statistic related to the aggregated location information corresponding to a particular virtual location.

3. The method of claim 1, wherein the selective summated display includes a selective display of members of a pal list who are subscribers of wireless service and whose mobile devices are determined to be present at a particular ordinal location.

4. The method of claim 1, wherein the aggregated location information includes virtual locations for a subset of the plurality of subscriber mobile devices including a virtual location for a second one of the plurality of subscriber mobile devices, and wherein the displaying further comprises displaying the virtual location for the second one of the plurality of subscriber mobile devices, the virtual location comprising a current page being browsed by the second one of the plurality of subscriber mobile devices, a current position within a multi-dimensional virtual environment, or a current position within an interactive multimedia presentation.

5. The method of claim 1, further comprising enabling at least a portion of the aggregated location information in a summated manner on a stationary computing device.

6. The method of claim 1, wherein the displaying comprises displaying at least a portion of the aggregated location information in a summated manner in real time.

7. The method of claim 1, further comprising receiving a manually entered location of a subscriber mobile device.

8. The method of claim 1, wherein the subscriber mobile devices are subscriber mobile devices of a wireless service, and wherein the physical location for at least one of the plurality of subscriber mobile devices is within a service area of the wireless service.

9. A server, comprising:
   (a) a memory for storing logical instructions;
   (b) a network interface unit for sending and receiving data and
   (c) a processor coupled to the memory and the network interface for executing the logical instructions stored in the memory, the execution of the logical instructions causing actions to be performed, including:
      (i) receiving data related to location information of a plurality of subscriber clients, the location information including an ordinal location for each of the plurality, the ordinal location comprising a position within a streamed and/or broadcast content,
      (ii) aggregating the received location information for a plurality of locations, including the ordinal locations for each of the plurality; and
      (iii) enabling at least a portion of the aggregated location information of the plurality of locations to be displayed by a requesting subscriber client, including the ordinal location of each of the plurality of subscriber clients.

10. The server of claim 9, wherein the server comprises a stationary computing device.

11. The server of claim 9, wherein the location information further comprises at least one location type selected from the group consisting of a physical, a virtual, and a manual location type.

12. A mobile device, comprising:
   (a) a memory for storing logical instructions;
   (b) a wireless interface unit for sending and receiving data; and
   (c) a processor coupled to the memory and the wireless interface unit for executing the logical instructions stored in the memory, the execution of the logical instructions causing actions to be performed, including:
      (i) receiving aggregated location information of a plurality of subscriber mobile devices, the location information including a physical location for at least one of the plurality; and
      (ii) enabling at a selective summated display of the aggregated location information corresponding to a particular physical location to be displayed on the mobile device, including the physical location for the at least one of the plurality, and an ordinal location of at least another one of the plurality, the ordinal location comprising a location within a user interface display different from the selective summated display or a position within a streamed and/or broadcast content.

13. The mobile device of claim 12, wherein the actions caused to be performed further comprise enabling playing of at least one selected from a group consisting of a radio broadcast, television broadcast and streamed content.

14. The mobile device of claim 12, wherein the actions caused to be performed further comprise enabling a web page to be browsed.

15. The mobile device of claim 12, wherein the aggregated location information includes at least one location type selected from the group consisting of a virtual location type, an ordinal location type, and a manual location type.

16. The mobile device of claim 12, wherein the selective summated display comprises members of a pal list corresponding to a subset of the plurality of subscriber mobile devices wherein the received aggregated location information includes a location of at least one of the members.

17. The mobile device of claim 12, further comprising enabling at least a portion of the aggregated location information in a summated manner in real time.

18. The mobile device of claim 12, wherein the mobile device is a selected one from the group consisting of a wireless mobile phone, a pager, a personal digital assistant (PDA), a palm-sized computing device, a laptop computer, a portable radio, a portable MPx player, and a portable CD/DVD player.

19. The mobile device of claim 12, wherein the actions caused to be performed further comprise determining a current location of the subscriber mobile device, and reporting the determined current location of the subscriber mobile device.

20. An apparatus, comprising:
   (a) means for determining location information for a plurality of subscriber mobile devices including a physical location for at least one of the plurality,
   (b) means for aggregating location information of the mobile devices and
   (c) means for enabling a selective summated display of the aggregated location information corresponding to a particular physical location to be displayed on at least one of the plurality of subscriber mobile devices, the selective summated display including a display of the physical location for at least the one of the plurality, and an ordinal location of another one of the plurality including a location within a user interface display different from the selective summated display or a position within a streamed and/or broadcast content.

21. A method comprising:
   (a) determining location information for each of a plurality of subscriber mobile devices, the location information including a physical location for at least one of the plurality of subscriber mobile devices,
   (b) aggregating the determined location information;
   (c) displaying a selective summated display of the aggregated location information corresponding to a particular physical location on a subscriber mobile device, the selective summated display including the physical location of the at least one of the plurality of subscriber mobile devices wherein the aggregated location information includes ordinal locations for a subset of the plurality of subscriber mobile devices including an ordinal location for a second one of the plurality of subscriber mobile devices and wherein the displaying comprises displaying the ordinal location for the second one of the plurality of subscriber mobile devices, the ordinal location comprising a location within a user interface display or a position within a streamed and/or broadcast content.

* * * * *